United States Patent
Ferrario et al.

(10) Patent No.: US 6,936,354 B2
(45) Date of Patent: Aug. 30, 2005

(54) SYSTEMS FOR CONVERSION OF WATER INTO HYDROGEN AND SORPTION OF HYDROGEN IN ELECTRONIC DEVICES

(75) Inventors: Bruno Ferrario, Rescaldina (IT); Stefano Tominetti, Milan (IT); Alessandro Gallitognotta, Origgio (IT)

(73) Assignee: SAES Getters S.p.A., Milan (IT)

( * ) Notice: Subject to any disclaimer, the term of this patent is extended or adjusted under 35 U.S.C. 154(b) by 0 days.

(21) Appl. No.: 10/256,560

(22) Filed: Sep. 27, 2002

(65) Prior Publication Data

US 2003/0087113 A1 May 8, 2003

(30) Foreign Application Priority Data

Sep. 27, 2001 (IT) ..................... MI2001A2010

(51) Int. Cl.⁷ .................. B32B 15/04; H05B 33/04
(52) U.S. Cl. ............... 428/686; 428/655; 428/658; 428/660; 428/690; 428/917; 313/512; 257/100
(58) Field of Search .................. 428/469, 472, 428/655, 658, 660, 686, 690, 917, 68, 76; 313/506, 512; 257/99, 100

(56) References Cited

U.S. PATENT DOCUMENTS 4,405,487 A    9/1983  Harrah et al.
5,408,832 A  * 4/1995  Boffito et al. ............. 62/45.1
5,882,761 A    3/1999  Kawami et al.
6,069,443 A    5/2000  Jones et al.
6,200,494 B1 * 3/2001  Manini et al. ........... 252/181.7

FOREIGN PATENT DOCUMENTS

| EP | 0 496 711 B1 | 1/1992 |
| EP | 0 720 260 A1 | 7/1996 |
| EP | 0 769 117 B1 | 9/1998 |
| EP | 0 757 920 B1 | 2/2000 |
| EP | 1 100 107 A2 | 11/2000 |
| JP | 5-142075 | 6/1993 |
| WO | WO 98/59356 | 12/1998 |
| WO | WO 99/48125 | 9/1999 |
| WO | WO 01/31717 | 10/2000 |

* cited by examiner

*Primary Examiner*—Jennifer McNeil
(74) *Attorney, Agent, or Firm*—Paul L. Hickman; Perkins Coie LLP (57) ABSTRACT

The invention teaches a system suitable for use in a water-sensitive electronic device which comprises two superimposed layers, the first material of which is formed of a material capable of sorbing hydrogen, the second material formed of a material capable of converting water into hydrogen; a screen of the type with light-emitting organic diodes comprising the system according to the invention.

19 Claims, 6 Drawing Sheets

SYSTEMS FOR CONVERSION OF WATER INTO HYDROGEN AND SORPTION OF HYDROGEN IN ELECTRONIC DEVICES

REFERENCE TO PRIORITY DOCUMENTS

This application claims priority under 35 U.S.C. 119 to Italian Application MI2001A2010, filed on Sep. 27, 2001, which is incorporated by reference for all purposes.

BACKGROUND

It is generally known in the art that the functionality of many electronic devices can be altered by the contact with water, even if only present in traces. In semiconductor devices water can oxidize the electric contacts or chemically alter some parts thereof, or of laser amplifiers used in optical fiber communications. This is described in EP-A-720260.

An electronic application of high industrial interest wherein absence of water is requested are electroluminescent screens based on the use of organic materials, is known in the field as OLEDs (from "Organic Light Emitting Devices").

The structure of an OLED is formed of a first transparent, essentially planar support, generally made of glass or of a plastic polymer; a first series of transparent linear and mutually parallel electrodes (generally having anode functionality), deposited on the first support; a double layer of different electroluminescent organic materials, of which the first layer is a conductor of electronic vacancies (also defined "holes") and the second of electrons, deposited on the first set of electrodes; a second series of linear and mutually parallel electrodes (generally having cathode functionality) that are orthogonally oriented with respect to those of the first series, in contact with the upper side of the double layer of organic materials, so that the latter is comprised between both series of electrodes; and a second not necessarily transparent support that may be made of glass, metal or plastics and is substantially planar and parallel to the first support. The two supports are secured to each other along their perimeter, generally by glueing, so that the active part of the structure (electrodes and electroluminescent organic materials) is in a closed space. The first transparent support is the part where the image is visualized, whereas the second support generally has only the function of closing and backing the device, in order to confer mechanical resistance thereto.

The anode is formed of a transparent conductive material, generally a mixed oxide of indium and tin ($In_2O_3$—$SnO_2$) which has the features of a semiconductor, known in the field with the acronym ITO (from "Indium Tin Oxide"), whereas the cathode is formed of alkali-earth metals, such as Ba, Ca, and Mg—Ag and Al—Li alloys. When a potential difference is applied to the electrodes, the electrons and the holes are conveyed to the organic material double layer and combine leading to the formation of photons, whose wave length depends on the nature of the organic material used.

For a description of the operating principles of OLEDs and greater details on their structure one can refer to the abundant literature of the field.

A problem encountered with the functioning of OLEDs is their deterioration following to exposure to moisture, which can react with the organic materials (generally polyunsaturated and therefore rather reactive species), as well as with the cathode, formed of particularly reactive metals. The portions concerned with these reactions loose their light-emitting functionality, thus forming black spots on the screen surface.

In order to overcome this problem, international publication WO 99/03122 describes the introduction into the internal space of an OLED of a gas reactive towards water, selected for example among silanes, trimethylaluminum or triethylaluminum. These gases react quickly with the water molecules subtracting them from the internal space of the OLED and generating reaction products which are not detrimental for the functioning of the device. The introduction of a gas in an OLED during the production thereof is however difficult to realize.

U.S. Pat. No. 5,882,761 teaches that the use of solid materials which chemically fix water by remaining in the solid state, such as for example calcium oxide (CaO). A possible problem with the use of this kind of sorbers is that these materials are generally in powder form, and therefore must be retained by a sheet (for example a nonwoven fabric) permeable to water but able to retain the powder particles. Due to the use of the powder material and of the permeable sheet, the minimum thickness of the component intended for water sorption cannot be lower than limit values of about 0.3–0.4 mm, whereas OLEDs manufacturers, in order to fully exploit the potentialities of these flat and thin screens, require moisture sorbing systems which have lower thickness values than the above mentioned ones. Another problem that does not allow the decrease the tickness of the sorbing systems based on the use of CaO or similar is the reduction of the water sorbing capacity.

International publication WO 98/59356 teaches the use of a getter material arranged inside the OLED and fixed onto the second support. This document indicates some alternatives to calcium oxide for water sorption; in particular it indicates the possibility to use materials such as barium, lithium, calcium, barium oxide or similar.

In particular, the metals lithium, barium, and calcium, being particularly reactive towards water, can be used in the devices in limited quantities.

Said metals react with water according to the reaction:

$$2M+2H_2O \rightarrow 2M(OH)+H_2 \quad \text{(wherein M: lithium)}$$

$$M+2H_2O \rightarrow M(OH)_2+H_2 \quad \text{(wherein M: barium and calcium)}$$

As it can be noted from the reaction stoichiometry, one or two molecules of metal hydroxides and one molecule of hydrogen are formed every two reacted water molecules. These metals are very reactive, and a drawback is that hydrogen can collect in the OLED thus building up a partial pressure inside the device which can pose safety problems.

Although hydrogen diffuses through the glue used for fixing the two supports of the device and therefore can move outwards, the velocity of hydrogen formation can be higher than the hydrogen permeation velocity through the OLED sealing, thus causing a continuous increase of the gas quantity in the internal space of the device.

BRIEF DESCRIPTION OF THE INVENTION

The present invention relates to systems for the conversion of water into hydrogen and for hydrogen sorption in electronic devices and to a process for manufacturing such systems. The invention therefore provides a system for the combined removal of water and hydrogen, to be used in water sensible devices, in a preferred use, for screens containing electroluminescent organic materials. In one embodiment, the system includes two superimposed layers directly in contact with each other, one of which is formed of a material capable of sorbing hydrogen, the other formed of a material capable of converting water into hydrogen.

BRIEF DESCRIPTION OF THE DRAWINGS

These advantages and the features of the invention will appear to those skilled in the art from the following detailed description with reference to the accompanying drawings, wherein.

DETAILED DESCRIPTION OF THE INVENTION

As previously stated, the invention includes function of removing traces of water and hydrogen from the internal space of electronic devices. To this end, it includes a layer of material capable of converting water into hydrogen and a layer of hydrogen sorbing material which is deposited on a substrate.

Various hydrogen sorbing materials can be used in different embodiments of the invention and include: titanium, zirconium, titanium-zirconium alloys, alloys of titanium containing a weight percentage of titanium not lower than 50%, zirconium alloys containing a weight percentage of zirconium not lower than 50%. Also, some unsaturated organic compounds coupled with traditional hydrogenation catalysts can be used, which is described by international publication WO 99/48125, which is incorporated by reference. The use of unsaturated organic molecules of low molecular weight provides significant advantage, such as for example 1,4-bis(phenylethynylbenzene), coupled for example with metallic palladium, since they can be easily deposited in thin layers on substrates through evaporation.

The material for converting water into hydrogen is selected in the group of the alkali or alkali-earth metals; although many materials can be used barium is used in a preferred embodiment.

In the case of an OLED the layer facing the internal space can be formed both of a hydrogen sorbing material and of a material capable of converting water into hydrogen; preferably, it is formed of the latter, so that in the following reference will be made to such a configuration. Furthermore, the two layers are superimposed and in contact with each other and can have the same or different shape and size; preferably the external layer covers entirely the internal one.

The substrates on which the system according to the invention can be deposited are various: the layers can be deposited directly on the OLED support facing the active element thereof, but also on other substrates, such as monoadhesive or biadhesive sheets.

Mono- and biadhesive sheets are well known and widely used in a number of technological applications. These sheets or tapes are generally formed of a support (a thin sheet of plastic material) on one or both faces of which there is provided a layer of adhesive material. For example, the support can be made in polyethyleneterephtalate (PET), with thickness values within 4 and 20 micron ($\mu$m), whereas the adhesive layers are made with acrylic materials having thickness values of the order of the tens of micron. Said adhesive sheets are sold by manufacturers with sheets of paper having the function of protecting the adhesive from contamination by external agents. Adhesive sheets or tapes of this kind are commercially available for example by Japanese company Nitto-Denko, with catalogue number HJ-3160W, or from Japanese company Teraoka with catalogue number 707.

Figure 1:
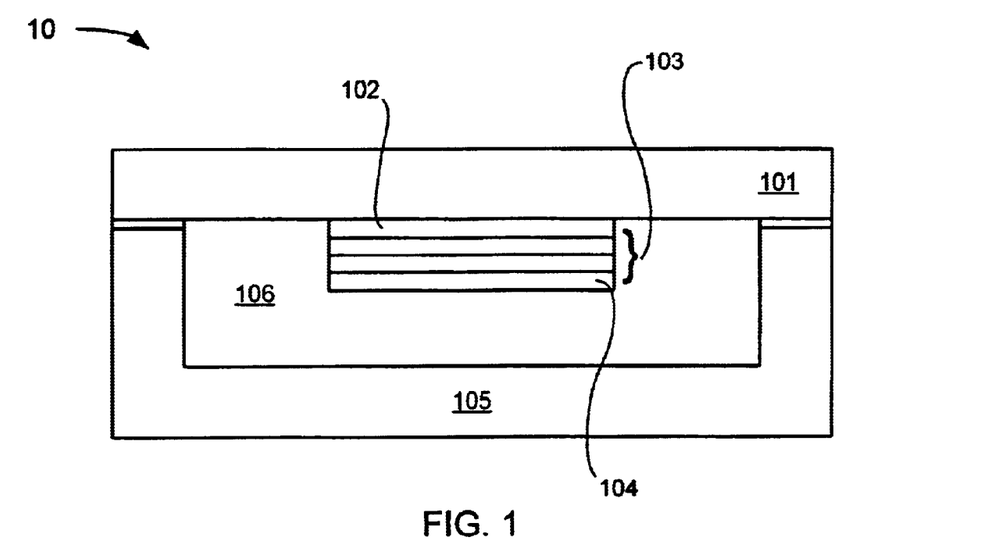
FIG. 1 schematically shows in cross-section an OLED device without a gas sorbing system.

FIG. 1 shows the cross-section of an OLED device 10: on a first transparent planar support 101 is present the active element of the device formed of a first series 102 of transparent, linear and mutually parallel electrodes, a double layer of electroluminescent organic materials 103 conductors of electronic vacancies (holes) and of electrons, and a second series 104 of linear electrodes, mutually parallel and orthogonal to those of the first series. A second support 105 planar and parallel to the first support is fixed thereto by means of a glue, thus defining the internal space 106.

Figure 2:
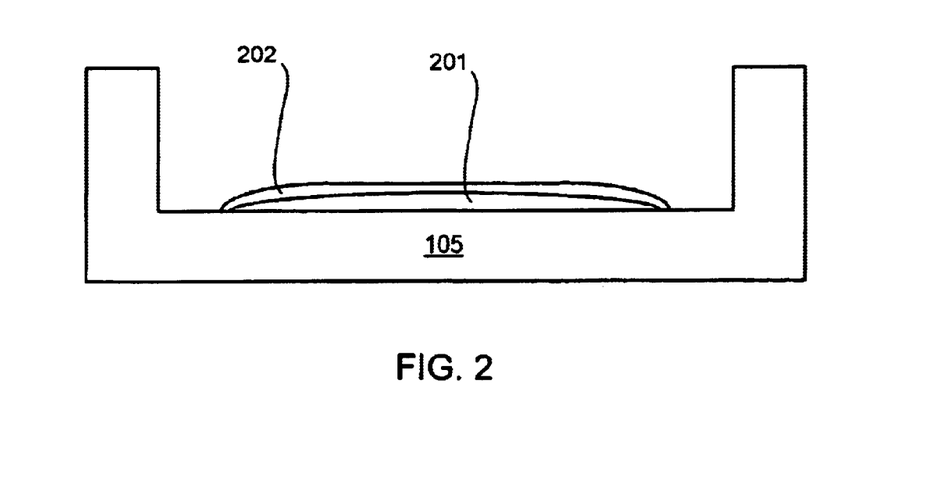
FIG. 2 shows a support of an OLED device, whereon the system according to a first embodiment of the invention.

FIG. 2 shows the support 105 of OLED 10, on which is arranged the system according to the invention in a first embodiment thereof. The system is formed of a layer 201 of material capable of sorbing hydrogen, directly deposited on the surface of the second support of the OLED and of a second layer 202 of a material capable of converting water into hydrogen, deposited onto the first layer.

Then, other embodiments are possible, which allow to obtain the system of the invention independently of the final device, that is, without involving elements of the latter during the preparation of said system.

Figure 3:
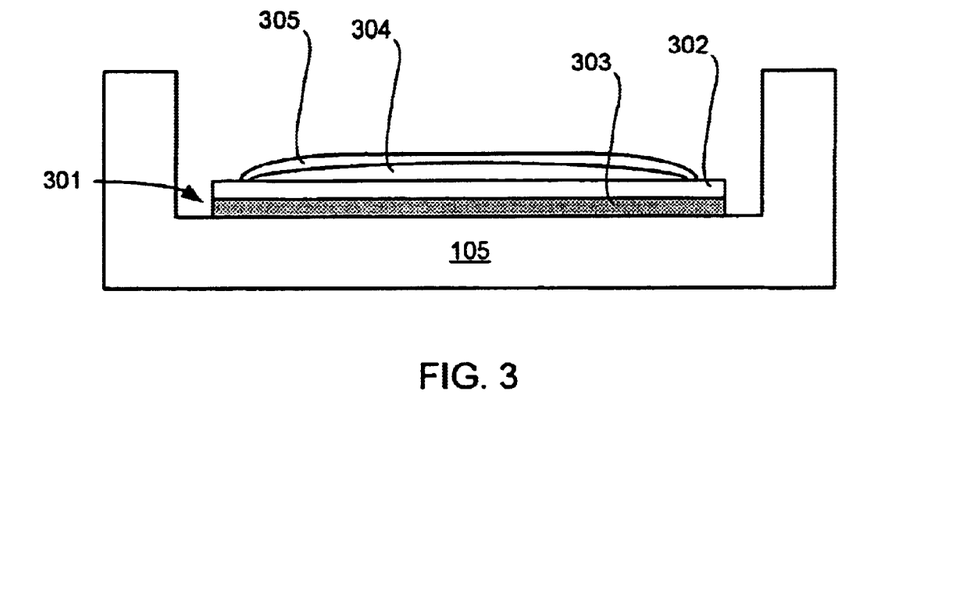
FIG. 3 shows a support of an OLED device, whereon the system according to the invention has been formed, in a alternate embodiment of the invention.

With this regard, the second embodiment of the invention is to be considered, shown in FIG. 3, which uses as a substrate a monoadhesive sheet: therein, the layer 304 of hydrogen sorbing material and the layer 305 of material capable of converting water into hydrogen have been deposited on a monoadhesive sheet 301, formed of a support 302, an adhesive layer 303. Soon after production, the system represented in FIG. 3 also comprises a protective sheet of paper covering the adhesive layer, but this protective sheet is removed before placing the system in contact with support 105, and is thus not shown in the drawing.

Figure 4:
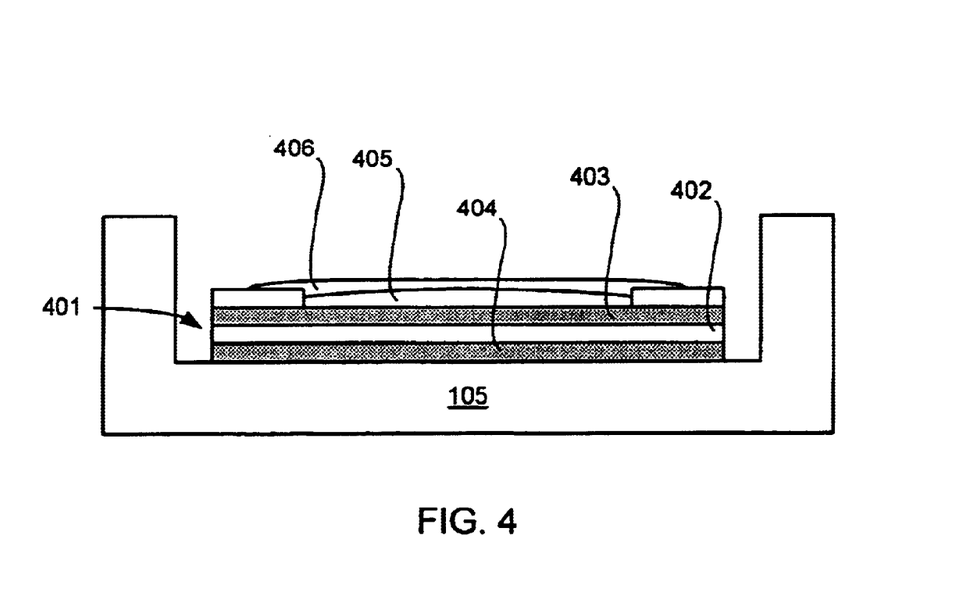
FIG. 4 shows a support of an OLED device, whereon the system according to the invention has been formed, in a second alternate embodiment of the invention.
Figure 5A:
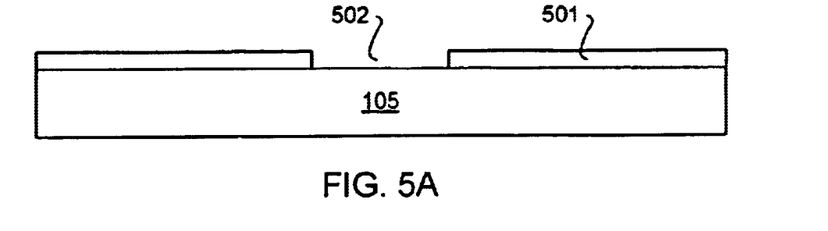
FIG. 5 schematically shows a possible manufacturing process of the first embodiment.
Figure 5B:
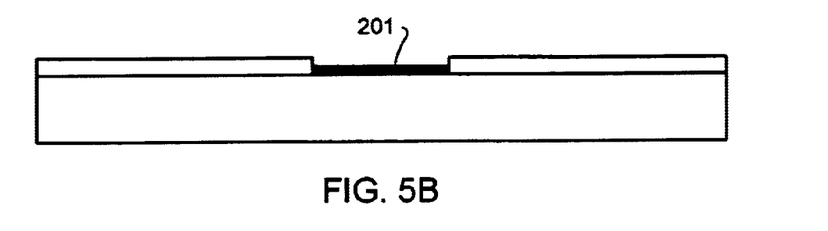
Figure 5C:
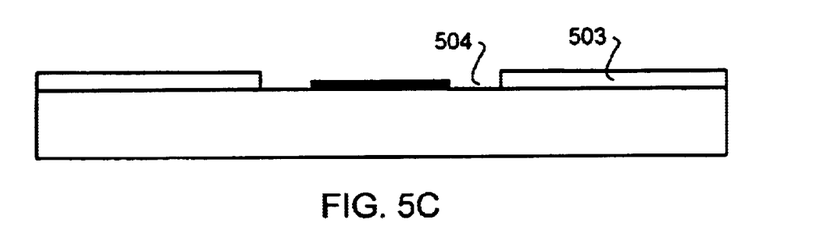
Figure 5D:
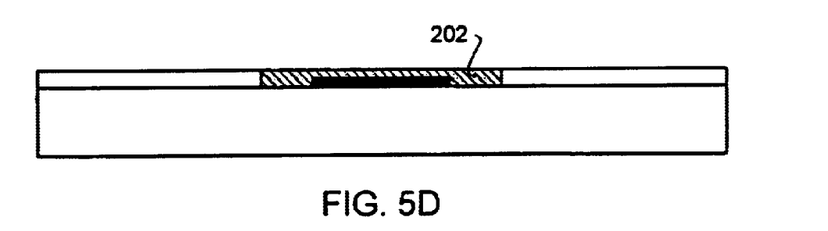
Figure 5E:
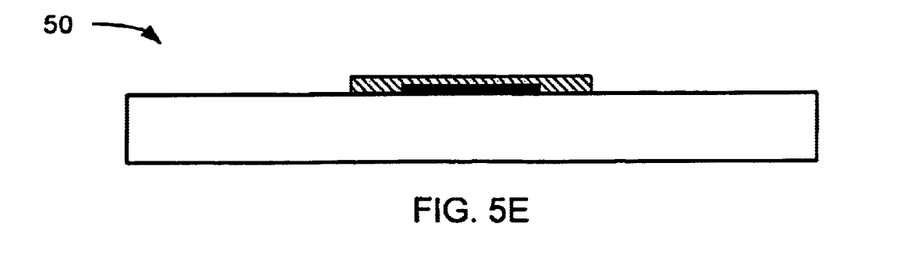

The third embodiment of the invention is shown in FIG. 4; therein, the layer 405 of hydrogen sorbing material and the layer 406 of material capable of converting water into hydrogen are deposited on a biadhesive layer 401, formed of a support 402 covered on both sides with adhesive layers 403, 404 and with paper sheets of which only some parts are shown in the figure.

An alternate use of the invention relates to manufacturing processes of the system in some possible above described embodiments.

The layer of hydrogen sorbing material can be deposited by means of a suitable technique which allows to form thin films: in the case of titanium and of the unsaturated organic compounds of low molecular weight, evaporation can be used, while in the case of the zirconium and of the alloys in general it is necessary to use other techniques, such as Physical Vapor Deposition, also known as PVD or "sputtering", which is well known in the art and does not need to be described here.

The film of material capable of converting water into hydrogen is deposited on this first layer: to this purpose various evaporation techniques can be used, among which, in the specific case of the barium, the technique based on the use of dispensers formed of threads having a U-shaped cross-section, which are loaded along the whole length thereof with an alloy of the metal.

These threads are connected to an electric current generator and when this is activated, the threads are heated by Joule effect thus reaching a temperature at which it is observed the formation of vapors of barium, which is allowed to deposit onto the layer of hydrogen sorbing material.

FIG. 5 shows the process for obtaining the first embodiment shown in FIG. 2. Onto the OLED support 105 is positioned a first masking element 501 having an opening 502 (FIG. 5a). Since said openings are called in the field "ports", said term will be used in the following. On element 501 is deposited, by means of one of the above mentioned techniques, layer 201 of hydrogen sorbing material (FIG. 5b). Subsequently, said masking element is removed and substituted with a second masking element 503 having a port 504 suitable for encompassing layer 201 (FIG. 5c). The material capable of converting water into hydrogen is then deposited on said second masking element, thus forming layer 202 (FIG. 5d). Finally, the second masking element is removed, leaving system 50 (FIG. 5e). In case it is desired to obtain superimposed layers having the same shape and size, it is not necessary to use a second masking step, but it is possible to use a single masking element, having the desired shape and size.

Because of the very high reactivity of the water converting material it is essential that the system does not contact moisture of the air; for this reason it must be protected both during the production and subsequently, maintaining it in an inert environment.

Figure 6A:
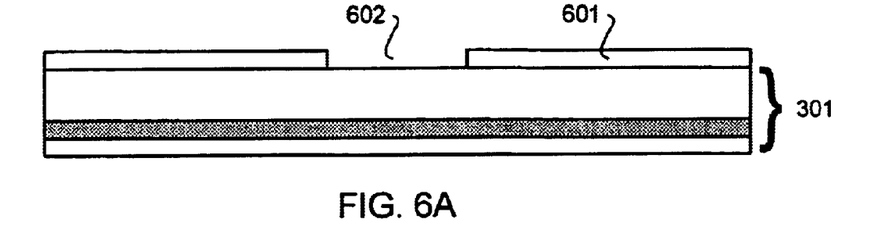
FIG. 6 schematically shows a manufacturing process of the second embodiment.
Figure 6B:
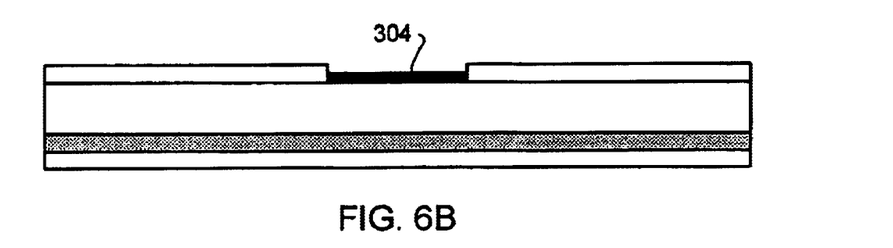
Figure 6C:
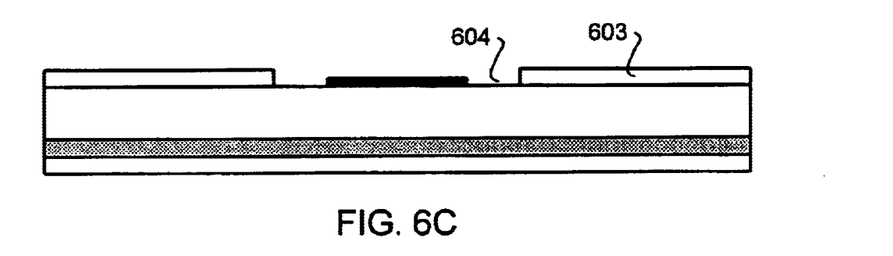
Figure 6D:
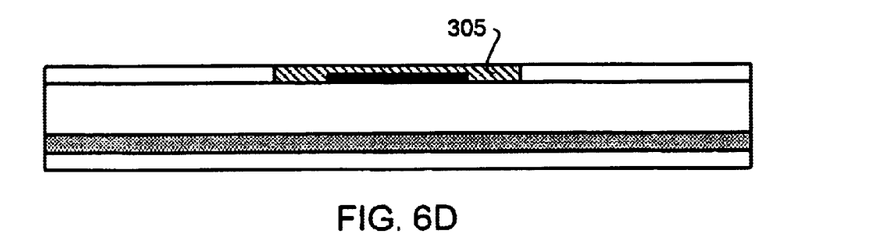
Figure 6E:
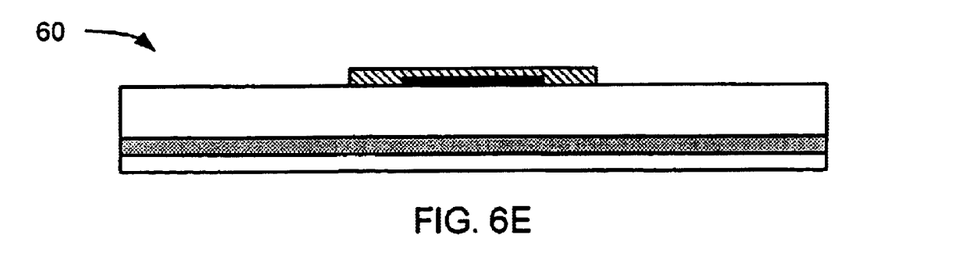

FIG. 6 schematically shows the process for obtaining the second embodiment illustrated in FIG. 3: on the monoadhesive sheet 301 is positioned a masking element 601, provided with a port 602 on the surface thereof (FIG. 6a). Subsequently layer 304 of hydrogen sorbing material is deposited (FIG. 6b). The used masking element is then removed and replaced with a second masking element 603 having a port 604 suitable for encompassing completely layer 304 (FIG. 6c). Subsequently it is carried out the second deposition, by evaporation, of the material capable of converting water into hydrogen, thus forming layer 305 (FIG. 6d). The next operation consists in removing said second masking element and cutting the monoadhesive sheet around the perimeter of the system thus obtaining th final system 60 (FIG. 6e).

Finally, in FIGS. 7 and 8 there are schematically shown two possible manufacturing processes of the third embodiment of the invention by using a biadhesive sheet as a substrate; in this case, it is possible to deposit the layer of moisture sorbing material through a step of filling to the top level, by using one of the two layers of adhesive.

Figure 7A:
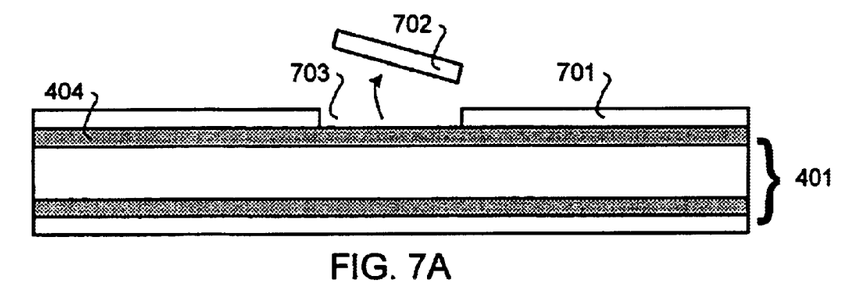
FIG. 7 schematically shows a first possible manufacturing process of the third embodiment.
Figure 7B:
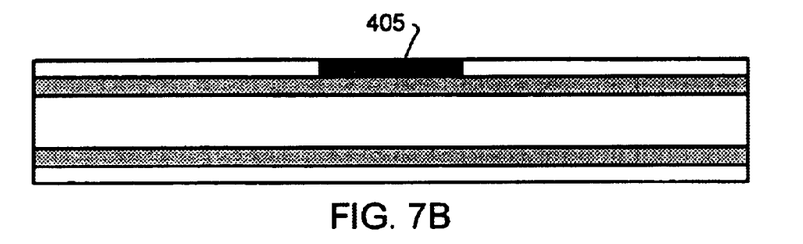
Figure 7C:
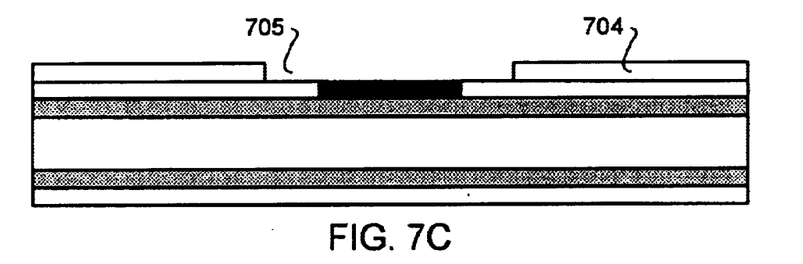
Figure 7D:
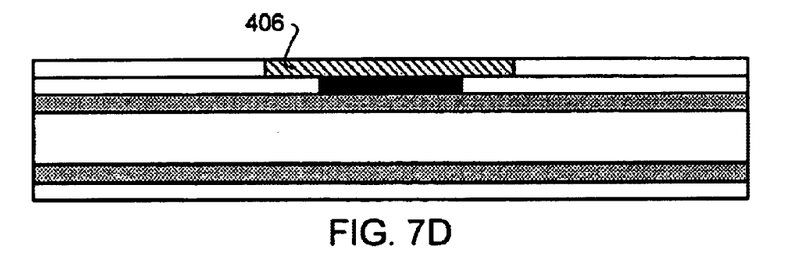
Figure 7E:
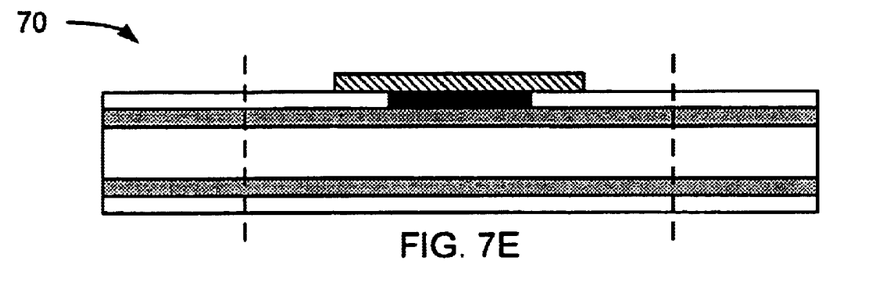

The process schematized in FIG. 7 consists in providing a biadhesive sheet 401 and in incising one of the layers of paper 701 which cover it, so as to selectively remove a portion 702 thereof and to leave uncovered the underlying adhesive 404: in this way a "cavity" 703 with vertical walls having a height equal to the thickness of the sheet of paper is obtained, and with the bottom covered with adhesive (FIG. 7a). The same paper thus works as a masking element for the next operation: said cavity is in fact filled to the top with the hydrogen sorbing material 405 (FIG. 7b). Then, a masking element 704 having a port 705 such as to encompass the cavity filled to the top is superimposed to the biadhesive (FIG. 7c) and the deposition of the material capable of converting water into hydrogen is carried out, which takes place on the masking element and on the cavity filled to the top with the hydrogen sorbing material, thus forming a layer 406 (FIG. 7d). By removing said masking element it is obtained, in correspondence of the original cavity, system 70 according to the invention, which can be isolated by cutting the biadhesive sheet around the perimeter of said system (FIG. 7e).

Figure 8A:
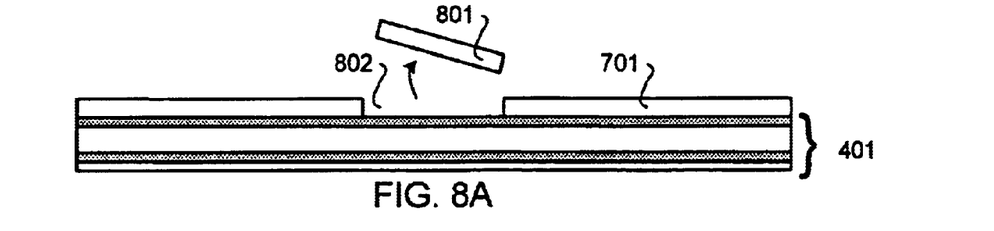
FIG. 8 schematically shows a second possible manufacturing process of the third embodiment.
Figure 8B:
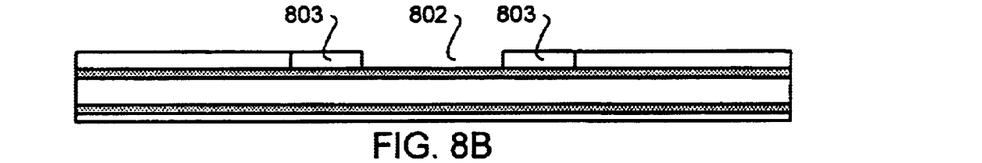
Figure 8C:
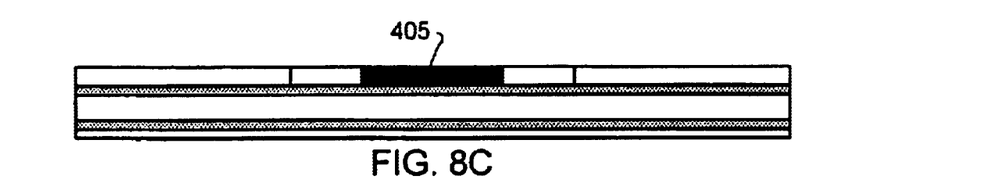
Figure 8D:
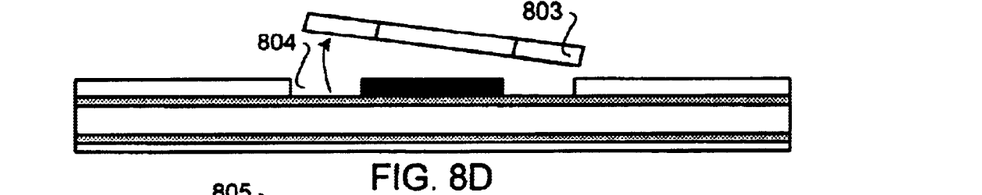
Figure 8E:
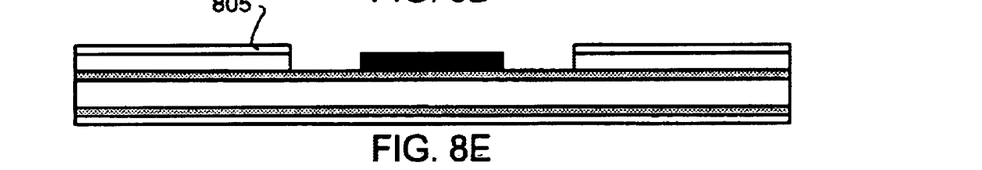
Figure 8F:
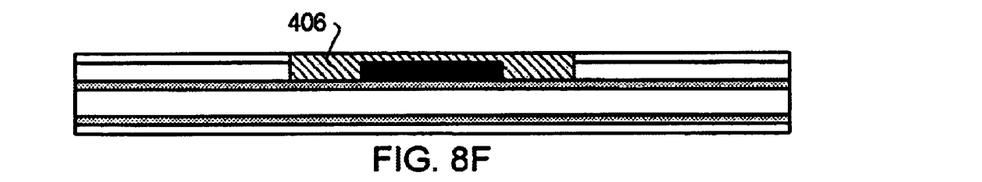
Figure 8G:
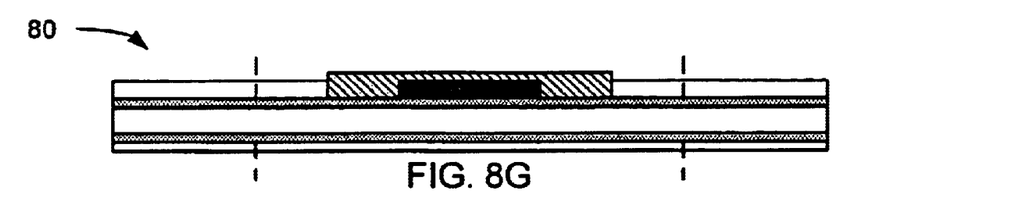

The process of FIG. 8 involves the following steps: first, one of the paper layers 701 of the biadhesive sheet 401 is incised thus allowing the removal of one portion 801 and the formation of the cavity 802 (FIG. 8a). Subsequently, the same paper layer is incised again along the perimeter of a zone encompassing cavity 802 (FIG. 8b), thus defining a portion 803 of paper. Then, said cavity is filled to the top with the hydrogen sorbing material thus forming layer 405 (FIG. 8c); at this point portion 803 is removed, leaving an opening 804 such as to encompass layer 405 of hydrogen sorbing material (FIG. 8d). A masking element 805 having a port coincident with said opening is laid onto the biadhesive (FIG. 8e) and the material capable of converting water into hydrogen is evaporated thereon thus forming layer 406 (FIG. 8f). The masking is then removed and the biadhesive can be cut around the perimeter of the double layer leaving system 80 (FIG. 8g).

The processes described in the case that mono- or biadhesive sheet are used have been illustrated with reference to the production of a single system, but, for reasons of productivity and economicity, they can be realized continuously in a quick and reproducible way. As a matter of fact, in the first case continuously fed monoadhesive tapes can be used, whereon a double masking is conducted in order to deposit selectively, by means of evaporation, the moisture sorbing material and the barium layer so as to form at the same time a number of systems. Subsequently the single systems can be obtained by shearing or mechanical cut, or alternatively, it is possible to carry out a punching step, by cutting with suitable tools the monoadhesive sheet along the edges of the different systems, but leaving the protective paper integral. Continuous tapes can be obtained in this way, on which a number of systems according to the invention are provided, which can then be separated from time to time like adhesive labels.

The same result is obtained by carrying out the punching step on the monoadhesive sheet before the deposition of the system according to the invention. Two different processes can be carried out in the case of the biadhesive sheet, as already observed. In the first case the steps to be carried out are the following: first, incision of one of the paper layers is carried out, defining the portions whereon the systems according to the invention will be formed, and the parts of paper over said portions are removed, thus obtaining cavities with vertical walls having a height equal to the thickness of the paper sheet, and with the bottom covered by adhesive. Then, filling to the top of said cavities with the hydrogen sorbing material is carried out. Subsequently, a second masking is realized with a masking element having ports such as to encompass the cavities filled to the top and evaporation of the material capable of converting water into hydrogen is carried out; when said evaporation is completed, the masking element is removed and the step of cutting or punching is at last carried out. In the last case, one obtains continuous tapes whereon a number of systems according to the invention are present, which can then be separated from time to time and applied to the supports of the final devices.

On the contrary, in order to carry out the second process the steps to be carried out are: first incision on one of the paper layers in order to define the portions on which the systems according to the invention will be formed, removal of the paper parts on said portions with formation of cavities, second incision along the perimeter of zones suitable for encompassing said cavities. The subsequent steps consist in filling to the top level the cavities with the material capable of sorbing hydrogen thus forming the correspondent layers, in removing the paper covering said zones encompassing the original cavities, in masking and depositing the second layer of material capable of converting water into hydrogen. After the removal of said masking the single systems can be then obtained also in this case by shearing or mechanical cut or punching.

As already observed in the case of the monoadhesive sheet, the step of punching the biadhesive sheet can also be carried out before the deposition of the system according to the invention.

Having thus described our invention, we claim:

1. A system for the removal of water and hydrogen comprising: two superimposed layers directly in contact with each other, a first layer which is formed of a material capable of sorbing hydrogen, a second layer formed of a material capable of converting water into hydrogen.

2. The system as recited in claim 1 wherein said material capable of converting water into hydrogen is selected among alkali or alkali-earth metals.

3. The system as recited in claim 2 wherein said material is barium.

4. The system as recited in claim 1 where said hydrogen sorbing material is selected from the group consisting of systems comprising unsaturated compounds and hydrogenation catalysts, titanium, zirconium, titanium-zirconium compounds, titanium alloys having a titanium weight percent not lower that 50%, zirconium alloys have a zirconium weight not lower than 50%.

5. The system of claim 1, wherein the second layer covers entirely the first layer.

6. An electronic device containing a system for the combined removal of water and hydrogen, said system comprising: two superimposed layers directly in contact with each other, said first layer of which is formed of a material capable of sorbing hydrogen, said second layer formed of a material capable of converting water into hydrogen, whereby said device is water sensible.

7. The device as recited in claim 6, consisting in a screen of the type with light-emitting organic diodes, formed of a first transparent support and of a second support joined along the whole perimeter thereof with a sealing material wherein an internal space is created; further comprised of a structure in contact with the first support formed of two series of electrodes orthogonal to each other with an interposed double layer of electroluminescent organic materials in between said electrodes.

8. The screen according to claim 7, wherein the layer formed of a material capable of converting water into hydrogen faces the interial space.

9. The device of claim 6, wherein the second layer covers entirely the first layer.

10. The device of claim 6, further comprising a support structure that defines an inner space therein, wherein said first layer and said second layer are coupled to the support structure within the inner space.

11. The device of claim 6, further comprising a light emitting diode coupled to the support structure within the inner space.

12. An organic light emitting device (OLED), comprising: a conversion layer, facing an internal space, for converting water within the internal space into hydrogen and oxygen; a sorption layer, coupled to the conversion layer, for sorbing the hydrogen from the conversion layer; and a support structure to which the sorption layer is attached.

13. The OLED of claim 12, wherein the conversion layer covers entirely the sorption layer.

14. The OLED of claim 12, wherein the conversion layer is positioned between the internal space and the sorption layer.

15. The OLED of claim 12, wherein the support structure is a first support structure, further comprising a second support structure, wherein the first and second support structures define a volume including the internal space.

16. The OLED of claim 12, further comprising an active element, and a second support structure to which the active element is attached.

17. The OLED of claim 12, an adhesive layer for attaching the sorption layer to the support structure.

18. The OLED of claim 12, a mono-adhesive sheet for attaching the sorption layer to the support structure.

19. The OLED of claim 12, a bi-adhesive sheet for attaching the sorption layer to the support structure.

* * * * *